United States Patent
Fan

(10) Patent No.: US 8,004,301 B2
(45) Date of Patent: Aug. 23, 2011

(54) TESTING DEVICE FOR PRINTED CIRCUIT BOARDS

(75) Inventor: Jun-Hui Fan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/764,067

(22) Filed: Apr. 20, 2010

(65) Prior Publication Data

US 2011/0175622 A1    Jul. 21, 2011

(30) Foreign Application Priority Data

Jan. 21, 2010  (CN) .......................... 2010 1 0300531

(51) Int. Cl.
  *G01R 31/20* (2006.01)
  *G01R 31/304* (2006.01)
(52) U.S. Cl. ............... 324/757.02; 324/763.02
(58) Field of Classification Search ............ 324/757.02, 324/324, 763.01
See application file for complete search history.

(56) References Cited

U.S. PATENT DOCUMENTS

| | | | | |
|---|---|---|---|---|
| 6,144,210 | A * | 11/2000 | Brooks | 324/519 |
| 6,538,420 | B2 * | 3/2003 | Bald et al. | 324/114 |
| 6,862,705 | B1 * | 3/2005 | Nesbitt et al. | 714/729 |
| 7,055,757 | B2 * | 6/2006 | Nishizawa et al. | 235/492 |
| 7,234,644 | B2 * | 6/2007 | Nishizawa et al. | 235/492 |
| 7,278,079 | B2 * | 10/2007 | Evans | 714/740 |
| 7,363,557 | B2 * | 4/2008 | Evans | 714/724 |
| 7,502,326 | B2 * | 3/2009 | Evans | 370/241 |
| 2010/0245675 | A1 * | 9/2010 | Fathollahi | 348/708 |

* cited by examiner

*Primary Examiner* — Huy Q Phan
*Assistant Examiner* — Joshua Benitez
(74) *Attorney, Agent, or Firm* — Altis Law Group, Inc.

(57) ABSTRACT

A testing device for testing functions of a printed circuit board (PCB) includes a transfer board electrically coupled to the PCB, and a controller board electrically coupled to the transfer board and the PCB. The transfer board includes a signal bus and a controller bus. The PCB is capable of running a test program stored therein to transmit instructions to the controller board; and the controller board is capable of transmitting control signals to the transfer board according to the instructions. The transfer board is capable of switching the PCB corresponding ports on/off; and the PCB information is capable of being transmitted to the controller board via the signal bus. The controller board is capable of converting the PCB information to network information which is uploaded to the internet.

7 Claims, 5 Drawing Sheets

TESTING DEVICE FOR PRINTED CIRCUIT BOARDS

BACKGROUND

1. Technical Field

The present disclosure relates to testing devices, and particularly to a testing device for testing functions of a printed circuit board (PCB).

2. Description of Related Art

After assembly, a printed circuit board (PCB) must be tested to insure quality. The test is for errors that occur during the assembling process of the PCB, such as open circuit, short circuit as well as the incorrect connection between the chips. After these detections, the error signals from the testing device are analyzed to find out where the error points are on the circuit board.

In one conventional arrangement, an untested PCB is connected to a testing board with a plurality of terminals, manually, then outputs the testing signals from the footprints of the chips and slots. Then the testing signals are inputted to different testing device for testing different chips and slots respectively. However, because there are so many elements on the PCB, it is time-consuming, labor intensive and prone to mistakes.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
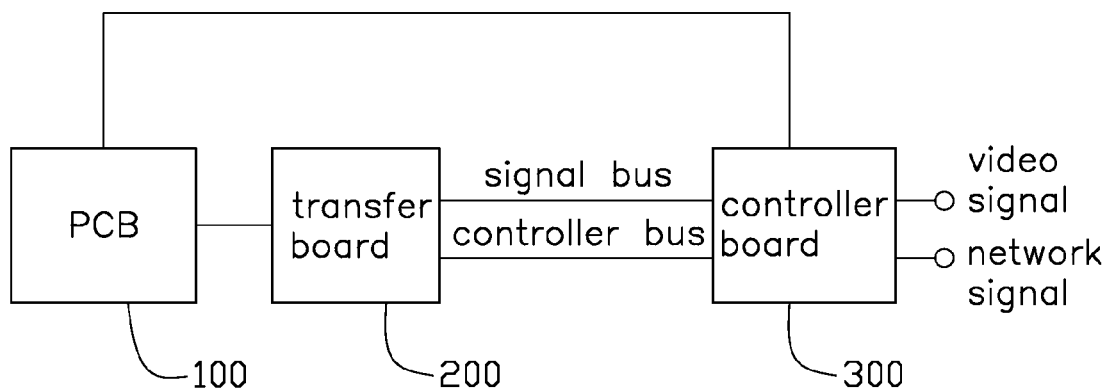
FIG. 1 is a block view of an embodiment of a testing device for printed circuit boards.

Referring to FIG. 1, a testing device in an embodiment for testing functions of a printed circuit board (PCB) 100, includes a transfer board 200, and a controller board 300. The transfer board 200 is electrically coupled to the controller board 300 via a signal bus and a controller bus. The PCB 100 is capable of running a test program stored therein to transmit instructions to the controller board 300. The controller board 300 is capable of transmitting control signals to the transfer board 200 via the controller bus according to the instructions. The transfer board 200 is capable of switching the PCB 100 corresponding ports on. The PCB 100 information is capable of being transmitted to the controller board 300 via the signal bus. The controller board 300 is capable of converting the PCB 100 information to network information, which is identified by and uploaded to the internet.

Figure 2:
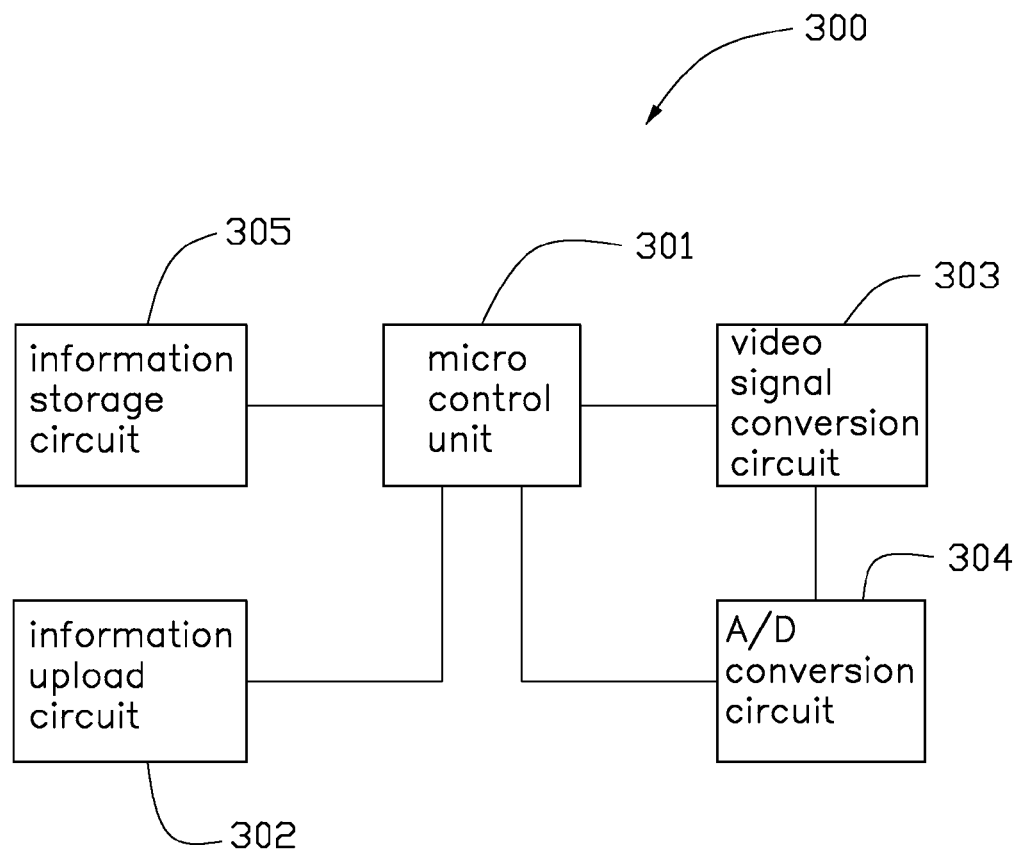
FIG. 2 is a block view of the controller module of FIG. 1.

Referring to FIG. 2, the controller board 300 includes a micro control unit 301, an information upload circuit 302, a video signal conversion circuit 303, an analog to digital (A/D) conversion circuit 304, and an information storage circuit 305. The micro control unit 301 is capable of receiving information from the PCB 100. The information upload circuit 302 is capable of converting the PCB 100 information to network information. The video signal conversion circuit 303 is capable of receiving multiple color signals from the PCB 100 via the signal bus, and converting the multiple color signals to a single color signal. The single video signal includes a red signal, a green signal, a blue signal, a horizontal refresh rate signal, and a vertical refresh rate signal.

The A/D conversion circuit 304 is capable of receiving the red, green, blue signals, and converting the red, green, blue analog signals to eight bits digital signals which are transmitted to the micro control unit 301. The information storage circuit 305 is capable of storing normal PCB 100 information. The micro control unit 301 is capable of comparing the received PCB 100 information with the normal PCB 100 information.

Figure 3:
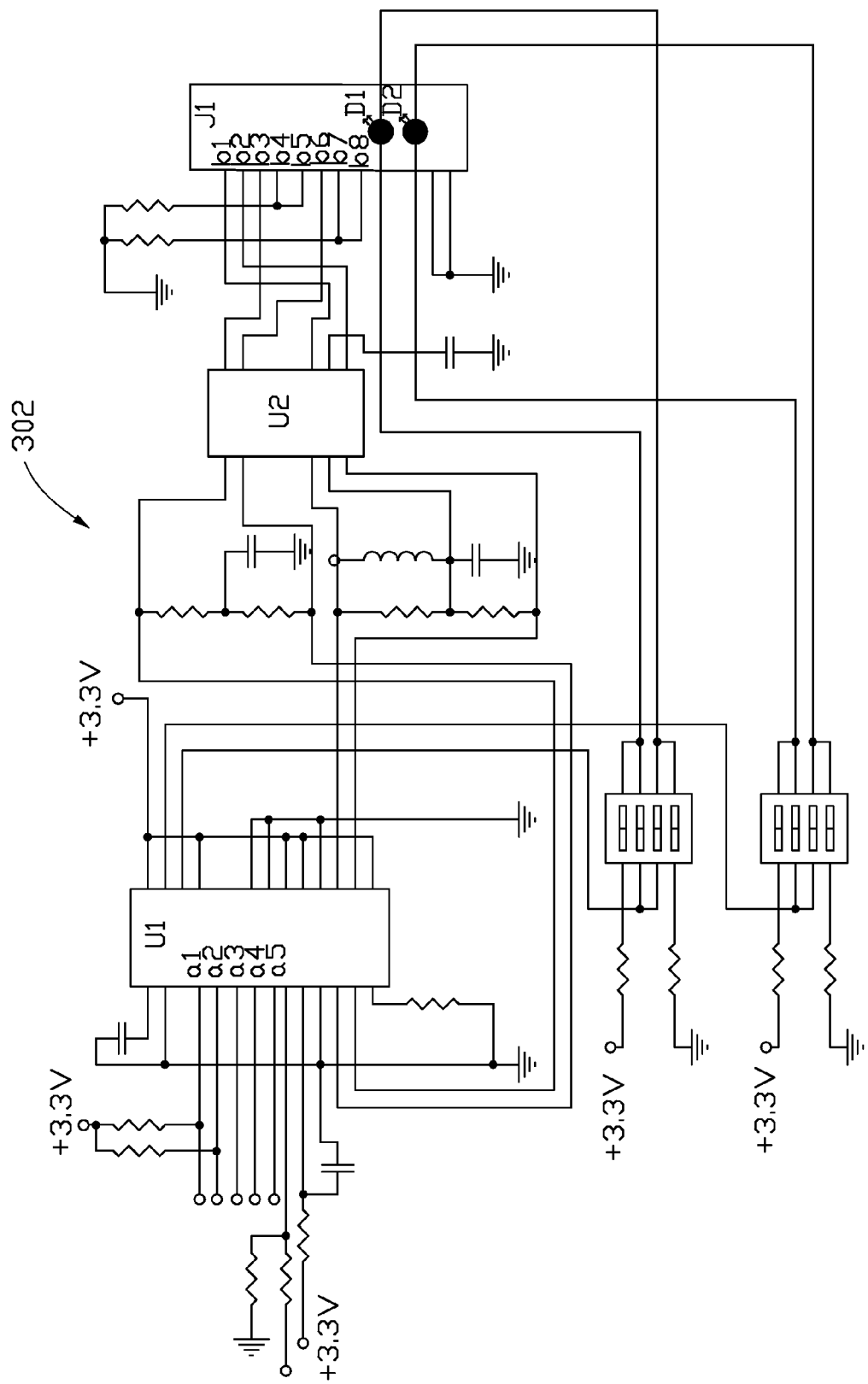
FIG. 3 is a circuit view of the information upload circuit of FIG. 2.
Figure 4:
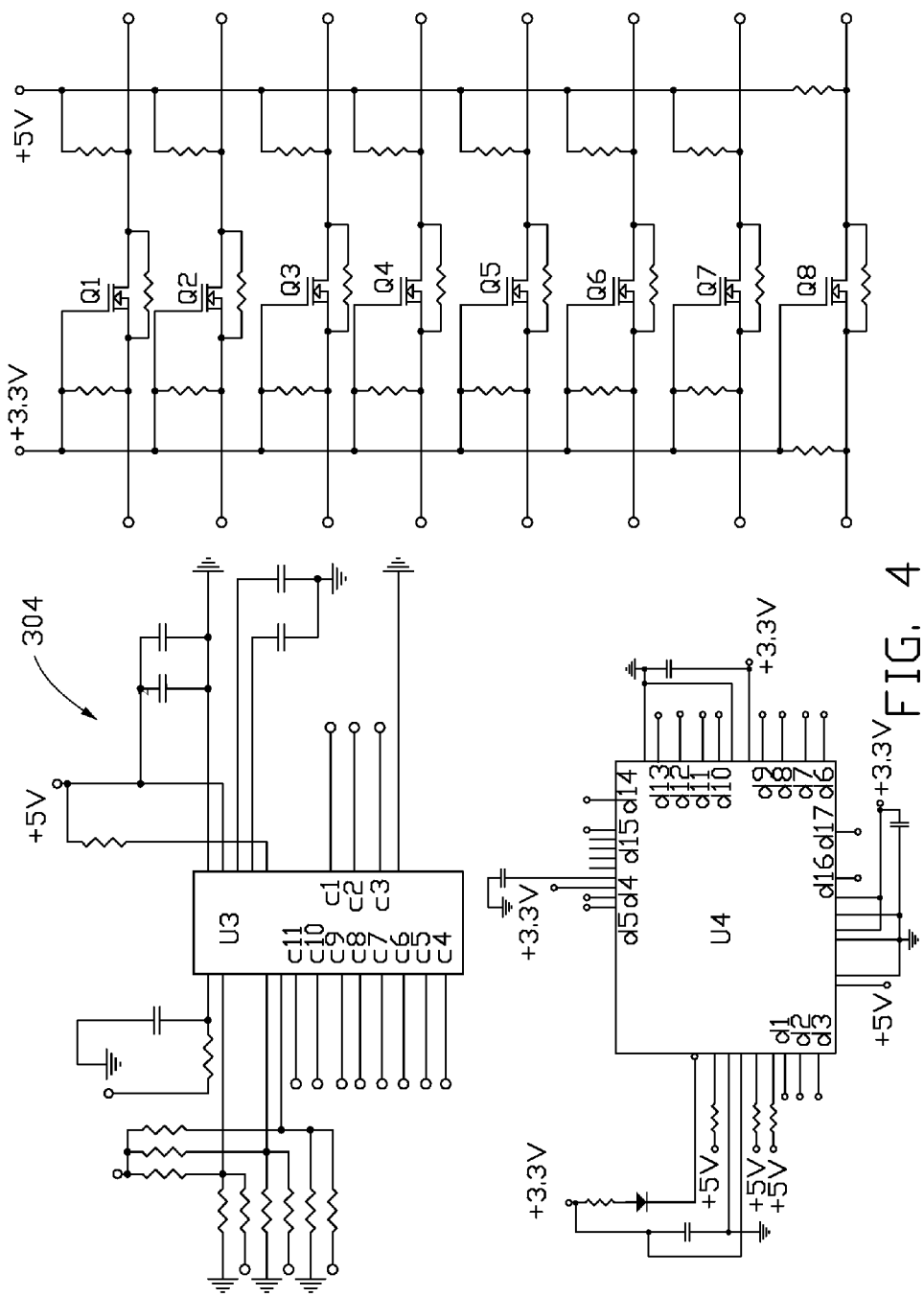
FIG. 4 is a circuit view of the analog to digital (A/D) conversion circuit and micro control unit of FIG. 2.
Figure 5:
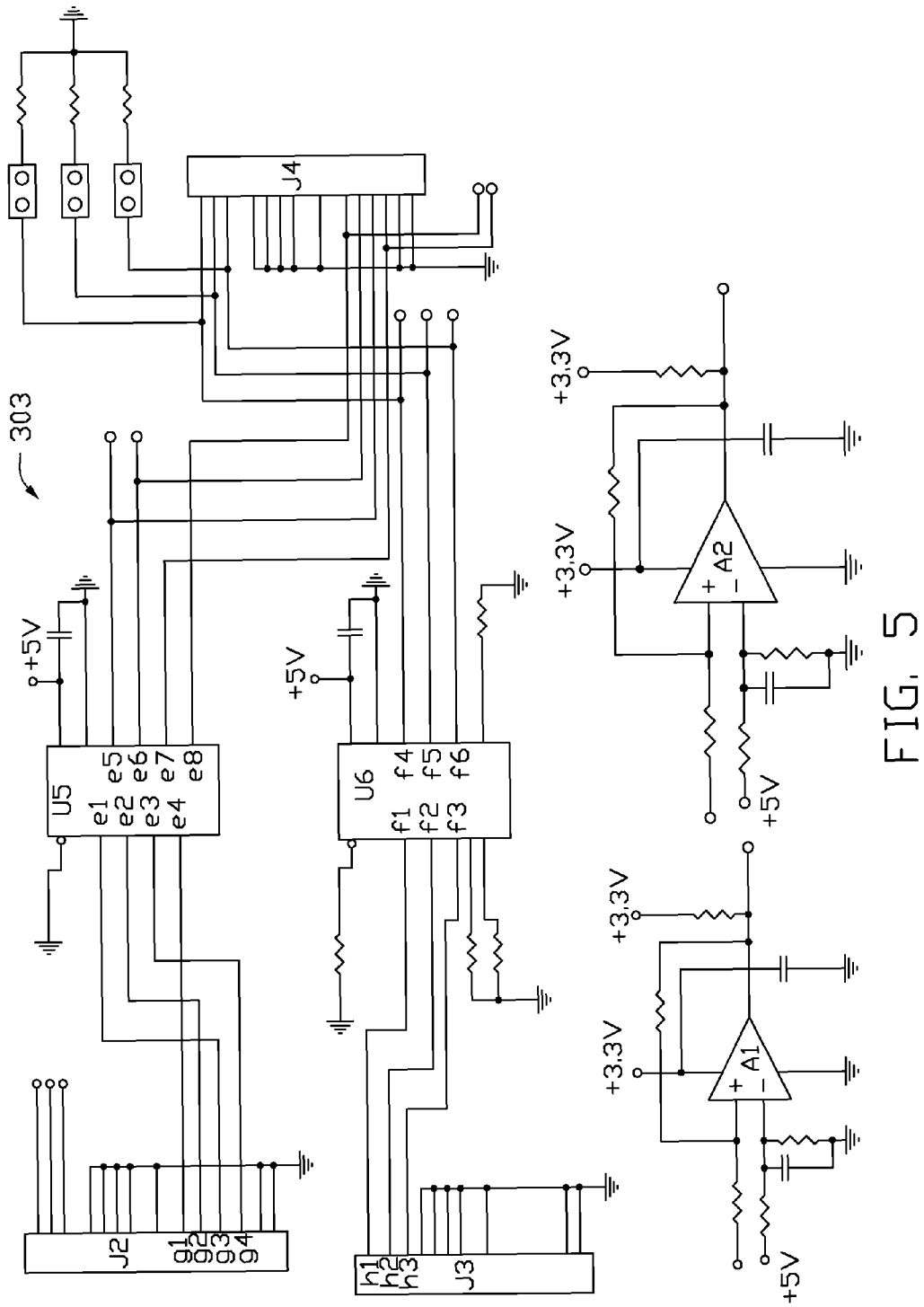
FIG. 5 is a circuit view of the video signal conversion circuit of FIG. 2.

Referring to FIGS. 3~5, the information upload circuit 302 includes a network information conversion chip U1, a network transformer chip U2, and a network connector J1. The network information conversion chip U1 includes data receiving terminals a1~a5 capable of receiving the PCB 100 information from the micro control unit 301. The network connector J1 includes data receiving terminals b1~b8.

The network information conversion chip U1 is capable of converting the received PCB 100 information to network information which is transmitted to the network transformer chip U2. The network transformer chip U2 is capable of decreasing a voltage level of the network information, and transmitting the voltage level decreased network information to the data receiving terminals b1~b8. The network connector J1 is capable of uploading the received network information to the internet. The user is capable of checking the PCB 100 status on the internet with a server computer. In one embodiment, the network connector J1 includes LEDs D1 and D2 for indicating transmission status of the network information.

The video signal conversion circuit 303 includes video signal conversion chips U5 and U6, comparators A1 and A2, and video signal connectors J2~J4. The video signal conversion chip U5 includes data receiving terminals e1~e4, and data transmitting terminals e5~e8. The video signal conversion chip U6 includes data receiving terminals f1~f3, and data transmitting terminals f4~f6. The video signal connector J2 includes a data terminal g1, a clock terminal g2, a horizontal refresh rate terminal g3, and a vertical refresh rate terminal g4. The video signal connector J3 includes video terminals h1~h3 for outputting the red, green, and blue signals.

The data receiving terminals e1~e4 are capable of receiving the data signals, clock signals, horizontal refresh rate signals, and vertical refresh rate signals from the data terminal g1, clock terminal g2, horizontal refresh rate terminal g3, and vertical refresh rate terminal g4 respectively. The video signal conversion chip U5 is capable of outputting the data signals, clock signals, horizontal refresh rate signals, and vertical refresh rate signals at the data transmitting terminals e5~e8.

The data receiving terminals f1~f3 are capable of receiving the red, green, and blue signals from the video terminals h1~h3 respectively. The video signal conversion chip U6 is capable of outputting the converted red, green, and blue signals at the data transmitting terminals f4~f6. The video signal conversion circuit 303 is capable of converting two video signals to a single video signal via the video signal conversion chips U5 and U6. The video signal conversion circuit 303 is capable of outputting the single video signal at the data transmitting terminals e5 and e6, and f4~f6.

In one embodiment, the data transmitting terminals e5 and e6 are capable of outputting the vertical refresh rate signals and horizontal refresh rate signals respectively. The comparators A1 and A2 are non-inverting input terminals and are capable of receiving the vertical refresh rate signals and horizontal refresh rate signals. The comparators A1 and A2 are capable of filtering the vertical refresh rate signals and horizontal refresh rate signals with voltage levels less than 5 volts.

The A/D conversion circuit 304 includes an A/D conversion chip U3, and N channel MOSFETs Q1~Q8. The A/D conversion chip U3 includes data receiving terminals c1~c3, and data transmitting terminals c4~c11. The data receiving terminals c1~c3 are capable of receiving the red, green, and blue signals form the data transmitting terminals f4~f6 of U6. The A/D conversion chip U3 is capable of converting the received red, green, and blue analog signals to eight bits digital signals which are output at the data transmitting terminals c4~c11.

The MOSFETs Q1~Q8 drains are capable of receiving the eight bits digital signals from the data transmitting terminals c4~c11. The MOSFETs Q1~Q8 sources are capable of outputting voltage level decreased eight bits digital signals. The micro control unit 301 includes a single chip U4 having data receiving terminals d1~d17. The data receiving terminals d1~d3 are capable of receiving the red, green, and blue signals from the data transmitting terminals f6~f4. The single chip U4 is capable of controlling the A/D conversion circuit 304 convert the red, green, and blue analog signals to eight bits digital signals.

The data receiving terminals d10~d17 are capable of receiving the eight bits digital signals respectively from the MOSFETs Q1~Q8 sources. The data receiving terminals d4, d5 are capable of receiving the filtered horizontal refresh rate signals and vertical refresh rate signals respectively. The data receiving terminals d1~d9 are electrically coupled to the information storage circuit 305. In one embodiment, the information storage circuit 305 is an erasable programmable read-only memory (EEPROM).

In test, the PCB 100 is electrically coupled to the testing device as shown in FIGS. 1~5. The PCB 100 is capable of running a test program stored therein to transmit instructions to the controller board 300. The controller board 300 is capable of transmitting control signals to the transfer board 200 via the controller bus according to the instructions. The transfer board 200 is capable of switching the PCB 100 corresponding ports on. The PCB 100 information is capable of transmitting to the controller board 300 via the signal bus.

The single chip U4 is capable of comparing the received PCB 100 information with the normal PCB information. The network information conversion chip U1 is capable of converting the received PCB 100 information to network information. The network transformer chip U2 is capable of decreasing the voltage level of the network information, and transmitting the voltage level decreased network information to the internet. The single chip U4 is capable of controlling the video signal conversion chips U5 and U6 convert two video signals to a single video signal. The single chip U4 is capable of controlling the A/D conversion chip U3 convert the red, green, and blue analog signals to eight bits digital signals. The single chip U4 is capable of comparing the eight bits digital signals with the normal PCB information.

The present testing device is capable of testing the PCB 100 corresponding ports by switching the transfer board 200 via the controller board 300. The controller board 300 is capable of converting the PCB 100 information to network information, and uploading the network information to the internet. Therefore efficiency of the test is improved, and the cost of the test is lowered.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A testing device for testing functions of a printed circuit board (PCB), comprising:
    a transfer board electrically coupled to the PCB; wherein the transfer board comprises a signal bus and a controller bus; and
    a controller board electrically coupled to the transfer board and the PCB;
    wherein the PCB is capable of running a test program stored therein to transmit instructions to the controller board; the controller board is capable of transmitting control signals to the transfer board according to the instructions; the transfer board is capable of switching the PCB corresponding ports on; the PCB information is capable of being transmitted to the controller board via the signal bus; the controller board is capable of converting the PCB information to network information which is identified by and uploaded to the internet.

2. The testing device of claim 1, wherein the controller board is capable of receiving multiple color signals from the PCB via the signal bus, and converting the multiple color signals to a single video signal.

3. The testing device of claim 2, wherein the controller board comprises a micro control unit capable of receiving the PCB information, and an information upload circuit capable of converting the PCB information to network information.

4. The testing device of claim 3, wherein the controller board further comprises a video signal conversion circuit capable of receiving the multiple color signals; the single color signal comprises a red signal, a green signal, a blue signal, a horizontal refresh rate signal, and a vertical refresh rate signal.

5. The testing device of claim 4, wherein the controller board further comprises an analog to digital (A/D) conversion circuit capable of receiving the red, green, blue signals, and converting the red, green, blue analog signals to eight bits digital signals which are transmitted to the micro control unit.

6. The testing device of claim 3, wherein the controller board further comprises an information storage circuit capable of storing the normal PCB information; the micro control unit is capable of comparing the received PCB information with the normal PCB information.

7. The testing device of claim 6, wherein the information storage circuit comprises an electronically erasable programmable read-only memory (EEPROM).

* * * * *